(12) United States Patent
Aldaz et al.

(10) Patent No.: US 6,476,626 B2
(45) Date of Patent: Nov. 5, 2002

(54) PROBE CONTACT SYSTEM HAVING PLANARITY ADJUSTMENT MECHANISM

(75) Inventors: Robert Edward Aldaz, Carol Stream, IL (US); Theodore A. Khoury, Evanston, IL (US)

(73) Assignee: Advantest, Corp., Tokyo (JP)

( * ) Notice: Subject to any disclaimer, the term of this patent is extended or adjusted under 35 U.S.C. 154(b) by 0 days.

(21) Appl. No.: 09/883,789

(22) Filed: Jun. 18, 2001

(65) Prior Publication Data

US 2002/0050832 A1 May 2, 2002

Related U.S. Application Data

(63) Continuation-in-part of application No. 09/583,837, filed on May 31, 2000.

(51) Int. Cl.[7] .............................................. G01R 31/02
(52) U.S. Cl. ...................... 324/757; 324/758; 324/754
(58) Field of Search .............................. 324/158.1, 758, 324/760, 754–757, 761, 762, 765; 439/682, 66–70; 374/57; 29/840, 842; 348/139–141

(56) References Cited

U.S. PATENT DOCUMENTS

| | | | |
|---|---|---|---|
| 5,084,671 A | * | 1/1992 | Miyata ........................ 324/760 |
| 5,506,498 A | * | 4/1996 | Anderson .................. 324/158.1 |
| 5,804,983 A | * | 9/1998 | Nakajima .................... 324/758 |
| 5,861,759 A | | 1/1999 | Bialobrodski et al. |
| 5,974,662 A | | 11/1999 | Eldridge et al. |
| 6,043,668 A | * | 3/2000 | Carney ........................ 324/758 |

* cited by examiner

Primary Examiner—Michael Sherry
Assistant Examiner—Trung Q. Nguyen
(74) Attorney, Agent, or Firm—Muramatsu & Associates

(57) ABSTRACT

A probe contact system is capable of adjusting distances between tips of the contactors and contact targets with simple and low cost mechanism. The planarity adjustment mechanism includes a contact substrate having a plurality of contactors mounted thereon, a probe card for fixedly mounting the contact substrate, a conductive elastomer provided between the contact substrate and the probe card, a gap sensor for measuring a distance between the contact substrate and the contact targets, a probe card ring provided on a frame of the probe contact system for mounting the probe card, and a plurality of shims provided between the probe card and the probe card ring wherein a number of shims is adjusted so that distances between tips of the contactors and surfaces of the contact targets become identical to one another.

9 Claims, 6 Drawing Sheets

PROBE CONTACT SYSTEM HAVING PLANARITY ADJUSTMENT MECHANISM

This is a continuation-in-part of U.S. application Ser. No. 09/583,837, filed May 31, 2000.

FIELD OF THE INVENTION

This invention relates to a semiconductor test system having a large number of contactors for establishing electrical connection with a semiconductor device under test, and more particularly, to a probe contact system having a planarity adjustment mechanism for adjusting distances between tips of the contactors and contact targets such as contact pads of the semiconductor wafer to be tested.

BACKGROUND OF THE INVENTION

In testing high density and high speed electrical devices such as LSI and VLSI circuits, a high performance contact structure provided on a probe card must be used. A contact structure is basically formed of a contact substrate having a large number of contactors or probe elements. The contact substrate is mounted on a probe card for testing LSI and VLSI chips, semiconductor wafers, burn-in of semiconductor wafers and dice, testing and burn-in of packaged semiconductor devices, printed circuit boards and the like.

In the case where semiconductor devices to be tested are in the form of a semiconductor wafer, a semiconductor test system such as an IC tester is usually connected to a substrate handler, such as an automatic wafer prober, to automatically test the semiconductor wafer. Such an example is shown in FIG. 1 in which a semiconductor test system has a test head 100 which is ordinarily in a separate housing and electrically connected to the test system with a bundle of cables 110. The test head 100 and a substrate handler 400 are mechanically as well as electrically connected with one another with the aid of a manipulator 500 which is driven by a motor 510. The semiconductor wafers to be tested are automatically provided to a test position of the test head 100 by the substrate handler 400.

On the test head 100, the semiconductor wafer to be tested is provided with test signals generated by the semiconductor test system. The resultant output signals from the semiconductor wafer under test (IC circuits formed on the semiconductor wafer) are transmitted to the semiconductor test system. In the semiconductor test system, the output signals are compared with expected data to determine whether the IC circuits on the semiconductor wafer function correctly or not.

In FIG. 1, the test head 100 and the substrate handler 400 are connected through an interface component 140 consisting of a performance board 120 (shown in FIG. 2) which is a printed circuit board having electric circuit connections unique to a test head's electrical footprint, coaxial cables, pogo-pins and connectors. In FIG. 2, the test head 100 includes a large number of printed circuit boards 150 which correspond to the number of test channels (test pins) of the semiconductor test system. Each of the printed circuit boards 150 has a connector 160 to receive a corresponding contact terminal 121 of the performance board 120. A "frog" ring 130 is mounted on the performance board 120 to accurately determine the contact position relative to the substrate handler 400. The frog ring 130 has a large number of contact pins 141, such as ZIF connectors or pogo-pins, connected to contact terminals 121, through coaxial cables 124.

As shown in FIG. 2, the test head 100 is placed over the substrate handler 400 and mechanically and electrically connected to the substrate handler through the interface component 140. In the substrate handler 400, a semiconductor wafer 300 to be tested is mounted on a chuck 180. In this example, a probe card 170 is provided above the semiconductor wafer 300 to be tested. The probe card 170 has a large number of probe contactors (such as cantilevers or needles) 190 to contact with contact targets such as circuit terminals or contact pads in the IC circuit on the semiconductor wafer 300 under test.

Electrical terminals or contact receptacles (contact pads) of the probe card 170 are electrically connected to the contact pins 141 provided on the frog ring 130. The contact pins 141 are also connected to the contact terminals 121 of the performance board 120 with the coaxial cables 124 where each contact terminal 121 is connected to the printed circuit board 150 of the test head 100. Further, the printed circuit boards 150 are connected to the semiconductor test system through the cable 110 having, for example, several hundreds of inner cables.

Under this arrangement, the probe contactors 190 contact the surface (contact targets) of the semiconductor wafer 300 on the chuck 180 to apply test signals to the semiconductor wafer 300 and receive the resultant output signals from the wafer 300. The resultant output signals from the semiconductor wafer 300 under test are compared with the expected data generated by the semiconductor test system to determine whether the IC circuits on the semiconductor wafer 300 performs properly.

A large number of contactors must be used in this type of semiconductor wafer test, such as from several hundreds to several thousands. In such an arrangement, it is necessary to planarize the tips of the contactors so that all of the contactors contact the contact targets at substantially the same time and same pressure. If planarization is not achieved, some contactors establish electrical connections with corresponding contact targets while other contactors fail to establish electrical connections, which is impossible to accurately test the semiconductor wafer. To completely connect all of the contactors to the contact targets, the semiconductor wafer must be further pressed against the probe card. This may physically damage semiconductor dice which receive excessive pressure by the contactors.

U.S. Pat. No. 5,861,759 shows an automatic probe card planarization system to planarize a first plane defined by a plurality of contact points of a probe card and relative to a second plane defined by a top surface of a semiconductor wafer supported on a prober. A camera is used to measure the height of at least three selected contact points on the probe card relative to the plane of wafer. Based on the measured values, the position of the first plane relative to the second plane is calculated.

With that information and the geometry of the prober and tester, the height variations necessary for the two height variable points are made to planarize the first plane relative to the second plane. This conventional technology requires a camera for visualizing the height of the contact points, resulting in increase in cost and decrease in reliability of the overall system.

U.S. Pat. No. 5,974,662 shows a method of planarizing tips of probe elements of a probe card assembly. The probe elements are mounted directly on a space transformer (contact substrate). It is so configured that the orientation of the space transformer, and thus the orientation of the probe elements, can be adjusted without changing the orientation of the probe card. In this method, an electrically conductive metal plate (virtual wafer) is provided in stead of the target semiconductor wafer as a reference plane. A cable and a computer are also provided in such a way that a computer display shows whether a conductive path is created or not for each probe tip relative to the metal plate by for example, white and black dots.

Based on the visual image on the display, the planarity of the probe tips is adjusted by rotating differential crews so that all of the probe tips make substantially simultaneous contact with the metal plate. Because this conventional technology uses a conductive metal plate to establish conductive path for all of probe elements, it requires an extra time to mount the metal plate and replace the same with the target semiconductor wafer. Further, because this method needs a computer and a display to illustrate the states of contact or non-contact of the probe element, an overall cost has to be increased.

Under the circumstances, there is a need in the industry to incorporate a more simple and economical way in a probe contact system to adjust the planarity of the contactors with respect to the surface of the semiconductor wafer.

SUMMARY OF THE INVENTION

Therefore, it is an object of the present invention to provide a probe contact system having a planarity adjustment mechanism for adjusting distances between tips of contactors and a surface of a semiconductor wafer under test.

It is another object of the present invention to provide a probe contact system having a planarity adjustment mechanism and a contact structure mounted on a probe card wherein the contact structure is formed of a contact substrate on which a large number of contactors are mounted.

It is a further object of the present invention to provide a probe contact system having a planarity adjustment mechanism for adjusting distances between a contact substrate and a semiconductor wafer under test so that all of contactors on the contact substrate contact the surface of the semiconductor wafer at the same time.

It is a further object of the present invention to provide a probe contact system having a planarity adjustment mechanism for adjusting distances between a contact substrate and a semiconductor wafer under test so that each contactor exerts an identical pressure against the surface of the semiconductor wafer when brought into contact with the semiconductor wafer.

In the present invention, a planarity adjustment mechanism for a probe contact system includes a contact substrate having a large number of contactors mounted on a surface thereof, a probe card for establishing electrical communication between the contactors and a test head of a semiconductor test system, connection means for fixedly connecting the contact substrate with the probe card, a probe card ring mounted on a frame of the probe contact system for mounting the probe card on an inner area thereof, and a plurality of shims provided between the probe card and the probe card ring at three or more locations wherein a number of shims at each of the locations is adjusted so that distances between tips of the contactors and surfaces of the contact targets become identical to one another.

In a further aspect, the planarity adjustment mechanism further includes a conductive elastomer provided between the contact substrate and the probe card. Preferably, the planarity adjustment mechanism of the present invention further includes a gap sensor for measuring a gap between the contact substrate and a semiconductor wafer to be tested or a reference plate (target substrate). The gap sensor determines the gap between the contact substrate and the target substrate by measuring capacitance between the gap sensor and an opposing electrode.

DETAILED DESCRIPTION OF THE PREFERRED EMBODIMENT

Figure 1:
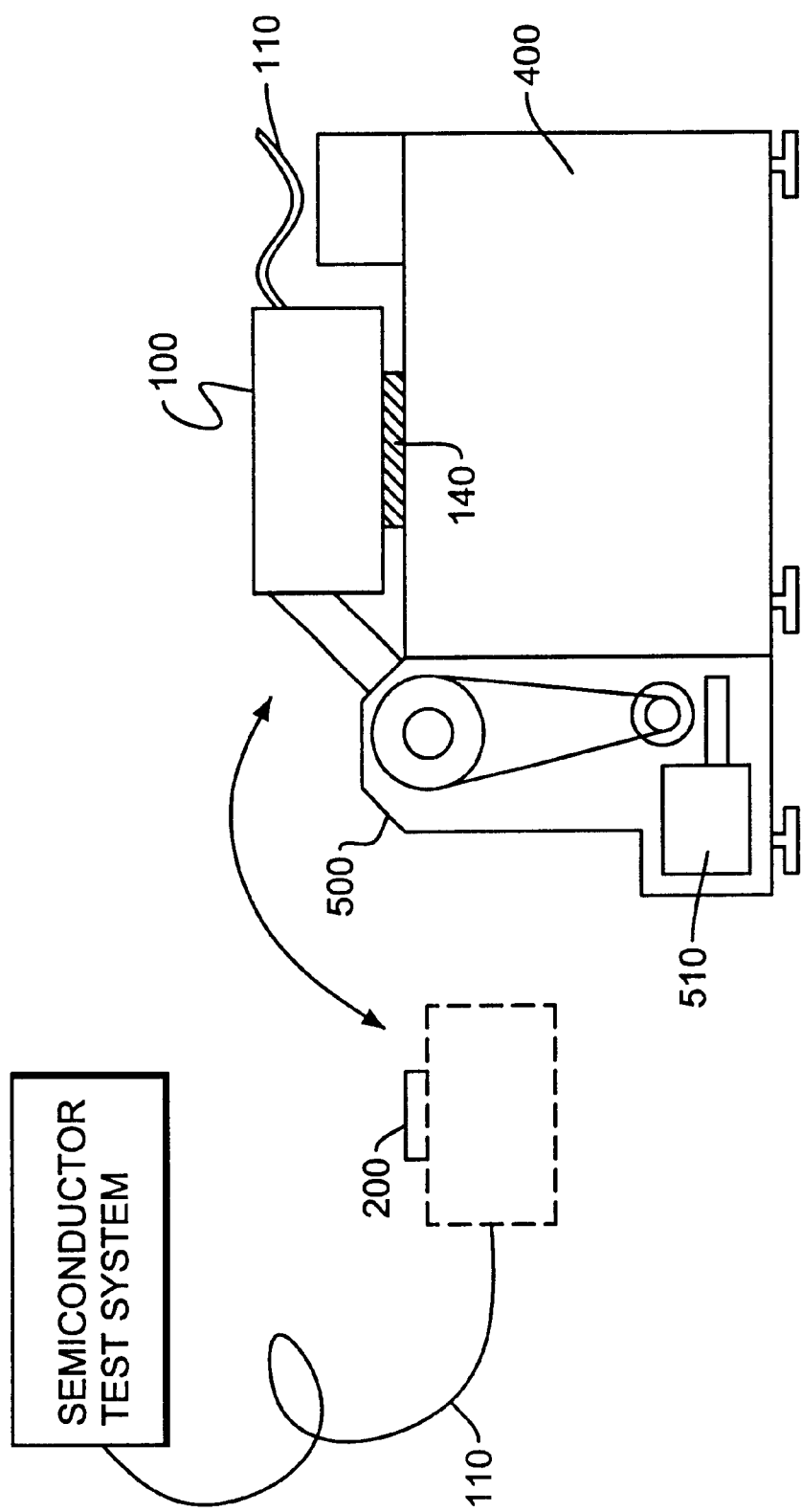
FIG. 1 is a schematic diagram showing a structural relationship between a substrate handler and a semiconductor test system having a test head.

An example of contact structure to be used in the probe contact system of the present invention will be described with reference to FIGS. 3 and 4. Many other different types of contact structures are also feasible in the probe contact system of the present invention. A contact structure 10 of FIG. 3 has beam like (silicon finger) contactors 30 produced through a microfabrication process such as a semiconductor production process.

The contact structure 10 is basically formed of a contact substrate 20 and the silicon finger contactors 30. The contact structure 10 is so positioned over contact targets such as contact pads 320 on a semiconductor wafer 300 to be tested that the contactors 30 establish electric connections with the semiconductor wafer 300 when pressed with each other. Although only two contactors 30 are shown in FIG. 3, a large number, such as from several hundreds to several thousands, of contactors 30 are aligned on the contact substrate 20 in actual applications such as semiconductor wafer testing.

Such a large number of contactors are produced through the same semiconductor production process such as a photolithography process on a silicon substrate and mounted on the contact substrate 20 which is made, for example of ceramic, silicon, alumina, or other material. The pitch between the contact pads 320 may be as small as 50 μm or less wherein the contactors 30 on the contact substrate 20 can easily be aligned in the same pitch since they are made through the same semiconductor production process as the wafer 300 are made.

Figure 2:
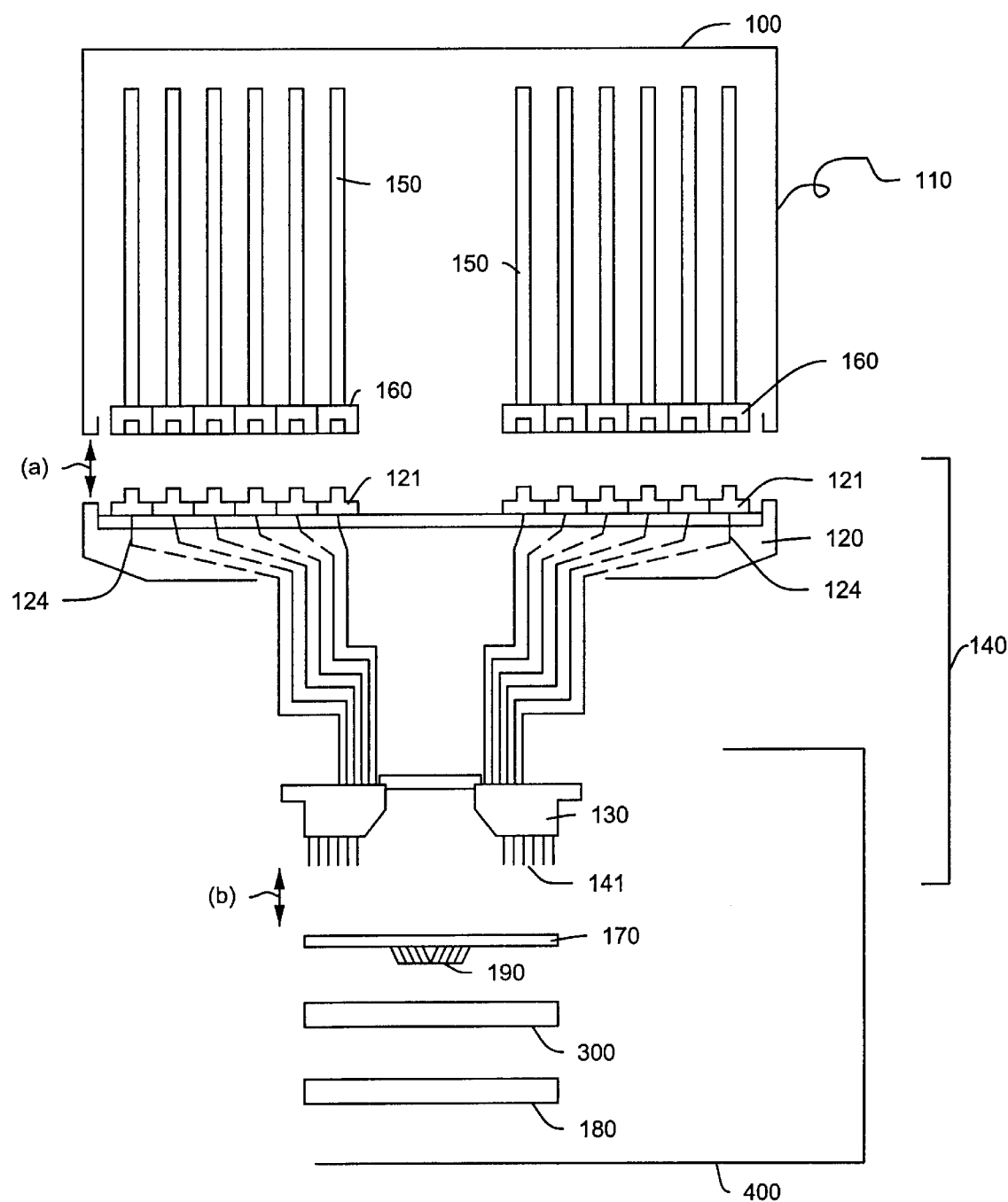
FIG. 2 is a diagram showing an example of detailed structure for connecting the test head of the semiconductor test system the substrate handler.
Figure 3:
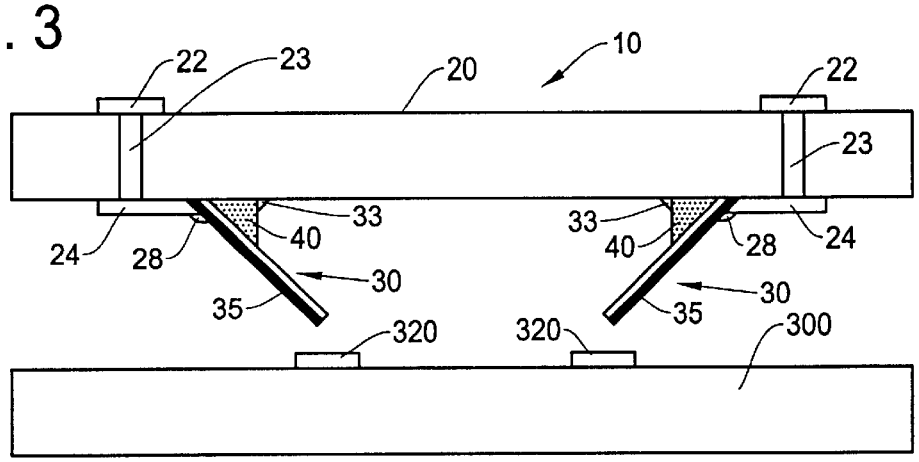
FIG. 3 is a cross sectional view showing an example of contact structure having beam like (silicon finger) contactors to be mounted on a probe card of the probe contact system of the present invention.
Figure 4:
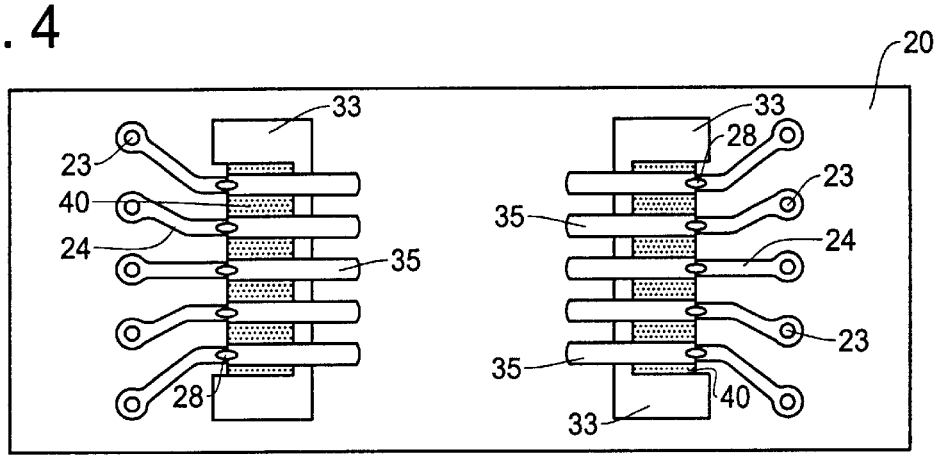
FIG. 4 is a schematic diagram showing a bottom view of the contact structure of FIG. 3 having a plurality of beam like contactors.

The silicon finger contactors 30 can be directly mounted on the contact substrate 20 as shown in FIGS. 3 and 4 to form a contact structure which then can be mounted on the probe card 170 of FIG. 2. Since the silicon finger contactors 30 can be fabricated in a very small size, an operable frequency range of a contact structure or probe card mounting the contactors of the present invention can be easily increased to 2 GHz or higher. Because of the small size, the number of contactors on a probe card can be increased to as many as, for example 2,000 or more, which is able to test as many as 32 or more memory devices in parallel at the same time.

In FIG. 3, each of the contactors 30 has a conductive layer 35 in a finger (beam) like shape. The contactor 30 also has a base 40 which is attached to the contact substrate 20. An interconnect trace 24 is connected to the conductive layer 35 at the bottom of the contact substrate 20. Such a connection between the interconnect trace 24 and the conductive layer 35 is made, for example, through a solder ball 28. The contact substrate 20 further includes a via hole 23 and an electrode 22. The electrode 22 is to interconnect the contact substrate 20 to an external structure such as a pogo-pin block or an IC package through a wire or a conductive elastomer.

Thus, when the semiconductor wafer 300 moves upward, the silicon finger contactors 30 and the contact targets 320 on the wafer 300 mechanically and electrically contact with each other. Consequently, a signal path is established from the contact target 320 to the electrodes 22 on the contact substrate 20. The interconnect trace 24, the via hole 23 and the electrode 22 also function to fan-out the small pitch of the contactors 30 to a larger pitch to fit to the external structure such as a pogo-pin block or an IC package.

Because of the spring force of the beam like shape of the silicon finger contactors 30, the end of the conductive layer 35 produces a sufficient contact force when the semiconductor wafer 300 is pressed against the contact substrate 20. The end of the conductive layer 35 is preferably sharpened to achieve a scrubbing effect when pressed against the contact target 320 for penetrating through a metal-oxide layer thereon.

For example, if the contact target 320 on the semiconductor wafer 300 has aluminum oxide on its surface, the scrubbing effect is necessary to establish an electrical connection with low contact resistance. The spring force derived from the beam like shape of the contactor 30 provides an appropriate contact force against the contact target 320. The elasticity produced by the spring force of the silicon finger contactor 30 also functions to compensate the differences in size or flatness (planarity) involved in the contact substrate 20, contact target 320 and semiconductor wafer 300, as well as the contactors 30. However, it is still necessary to incorporate a planarity adjustment mechanism of the present invention to fully connect all of the contactors to the contact targets at substantially the same time and pressure.

An example of material of the conductive layer 35 includes nickel, aluminum, copper, nickel palladium, rhodium, nickel gold, iridium or several other depositable materials.

An example of size of the silicon finger contactor 30 intended for a semiconductor test application is 100–500 μm in overall height, 100–600 μm in horizontal length, and about 30–50 μm in width for the pitch of 50 μm or more between contact targets 320.

FIG. 4 is a bottom view of the contact substrate 20 of FIG. 3 having a plurality of silicon finger contactors 30. In an actual system, a larger number of contactors, such as several hundreds of them, will be aligned in the manner shown in FIG. 4. The interconnect traces 24 expand the pitch of the contactors 30 to the pitch of the via holes 23 and electrodes 22 as shown in FIG. 4. Adhesives 33 are provided at contact points (inner areas of contactors 30) between the substrate 20 and the bases 40 of the contactors 30. The adhesives 33 are also provided at the sides (top and bottom of contactors 30 in FIG. 4) of the set of contactors 30. An example of adhesives 33 includes thermosetting adhesives such as epoxies, polyimide and silicone, and thermoplastic adhesives such as acrylic, nylon, phenoxy and olefin, and UV cured adhesives.

Figure 5:
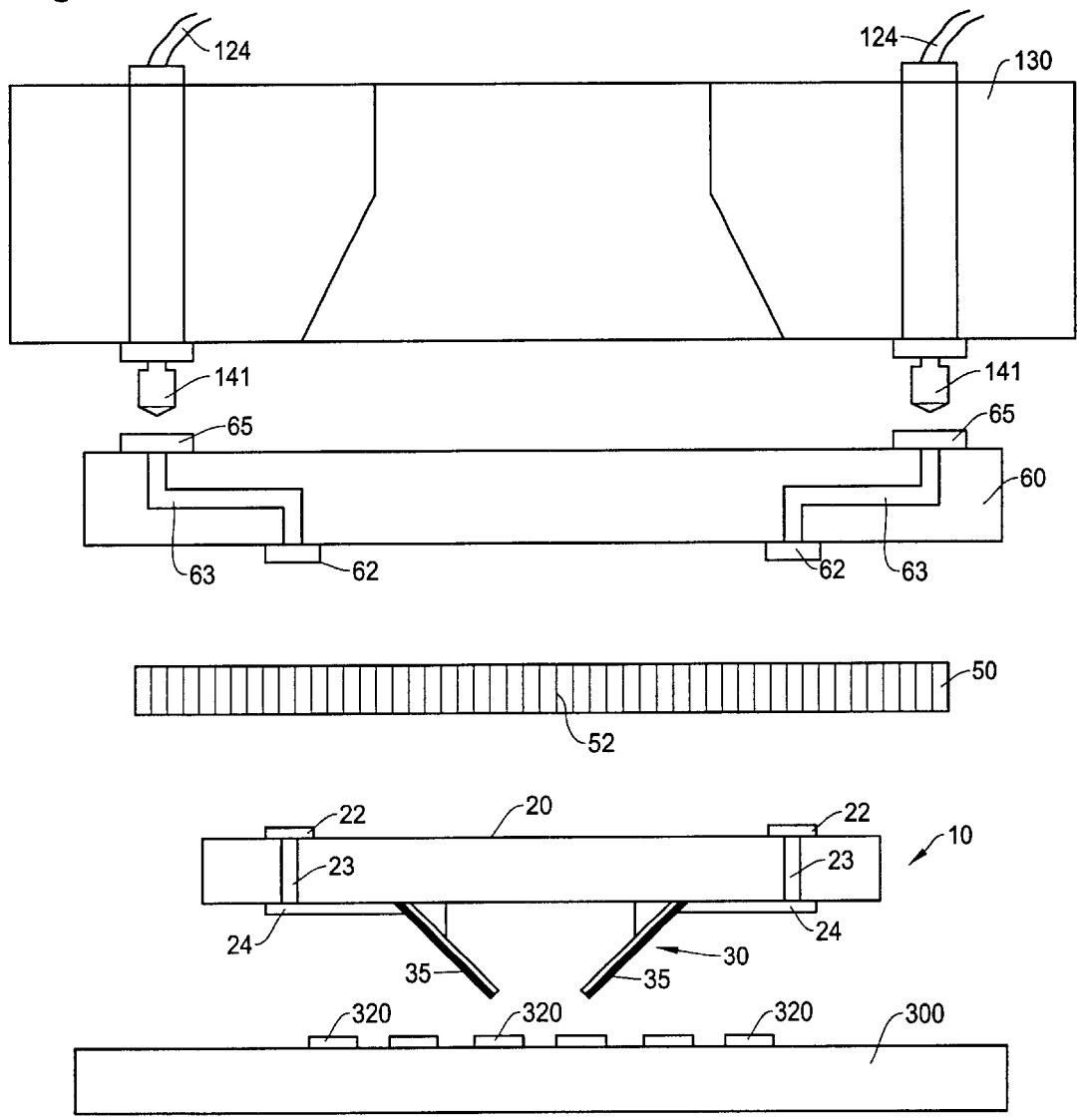
FIG. 5 is a schematic diagram showing a cross sectional view of an example of total stack-up structure in a probe contact system using the contact structure of FIGS. 3 and 4 as an interface between the semiconductor device under test and the test head of FIG. 2.

FIG. 5 is a cross sectional view showing an example of total stack-up structure forming a probe contact system using the contact structure of FIGS. 3 and 4. The probe contact system will be used as an interface between the semiconductor device under test and the test head of FIG. 2. In this example, the interface assembly includes a conductive elastomer 50, a probe card 60, and a pogo-pin block (frog ring) 130 provided over the contact structure 10 in the order shown in FIG. 5.

The conductive elastomer 50, probe card 60 and pogo-pin block 130 are mechanically as well as electronically connected with one another. Thus, electrical paths are created from the tip of the contactors 30 to the test head 100 through the cables 124 and performance board 120 (FIG. 2). Thus, when the semiconductor wafer 300 and the probe contact system are pressed with each other, electrical communication will be established between the device under test (contact pads 320 on the wafer 300) and the semiconductor test system.

The pogo-pin block (frog ring) 130 is equivalent to the one shown in FIG. 2 having a large number of pogo-pins to interface between the probe card 60 and the performance board 120. At upper ends of the pogo-pins, cables 124 such as coaxial cables are connected to transmit signals to printed circuit boards (pin electronics cards) 150 in the test head 100 in FIG. 2 through the performance board 120. The probe card 60 has a large number of contact pads or electrodes 62 and 65 on the upper and lower surfaces thereof. The electrodes 62 and 65 are connected through interconnect traces 63 to fan-out the pitch of the contact structure to meet the pitch of the pogo-pins in the pogo-pin block 130.

The conductive elastomer 50 is provided between the contact structure 10 and the probe card 60. The conductive elastomer 50 is to ensure electrical communications between the electrodes 22 of the contact structure and the electrodes 62 of the probe card by compensating unevenness or vertical gaps therebetween. The conductive elastomer 50 is an elastic sheet having a large number of conductive wires in a vertical direction. For example, the conductive elastomer 250 is comprised of a silicon rubber sheet and a multiple rows of metal filaments. The metal filaments (wires) are provided in the vertical direction of FIG. 5, i.e., orthogonal to the horizontal sheet of the conductive elastomer 250. An example of pitch between the metal filaments is 0.02 mm with thickness of the silicon rubber sheet is 0.2 mm. Such a conductive elastomer is produced by Shin-Etsu Polymer Co. Ltd and available in the market.

Figure 6:
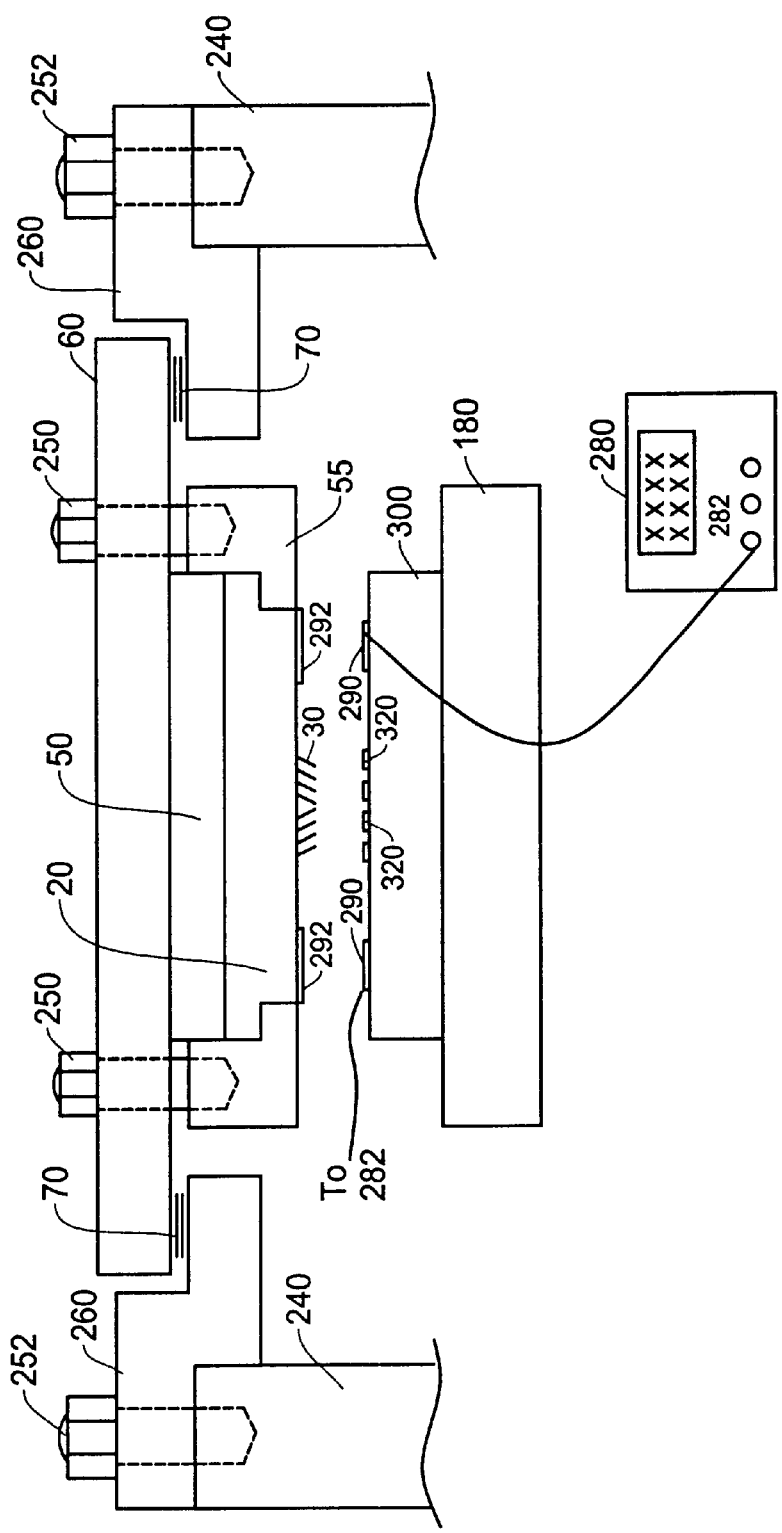
FIG. 6 is a cross sectional view showing an example of structure of a probe contact system having a planarity adjustment mechanism of the present invention.
Figure 7:
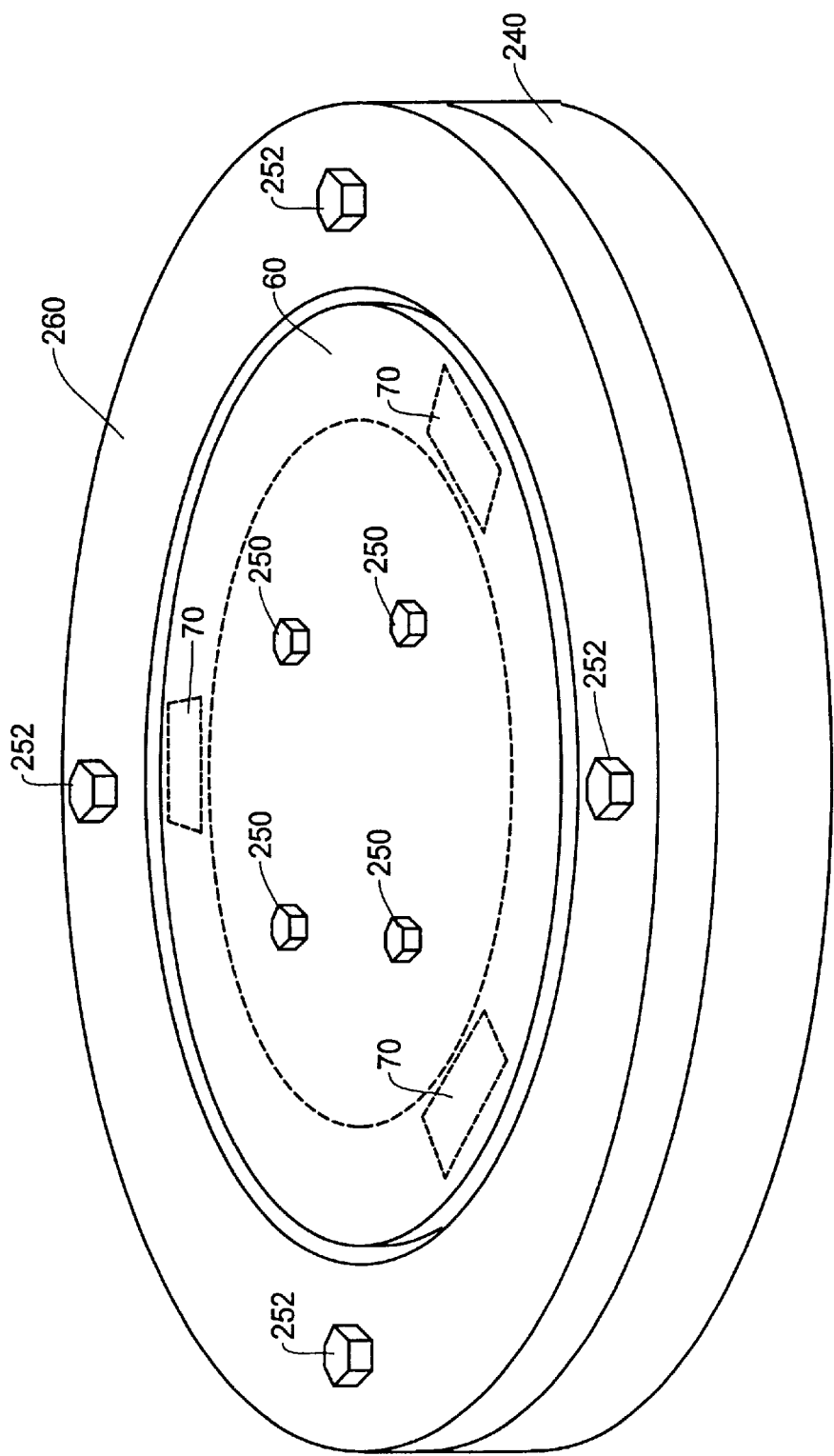
FIG. 7 is a perspective view showing an upper surface of the probe contact system of the present invention having the planarity adjustment mechanism of FIG. 6.

FIGS. 6 and 7 illustrate an example of structure of a probe contact system having a planarity adjustment mechanism of the present invention. FIG. 6 is a cross sectional view and FIG. 7 is a perspective view of the probe contact system of the present invention.

The contact substrate 20 having a plurality of contactors 30 is mounted on the probe card 60 through a support frame 55 and a conductive elastomer 50. The support frame 55 for supporting the contact substrate 20 is connected to the probe card 60 by means of fastening means such as screws 250. As described with reference to FIG. 5, the conductive elastomer 50 establishes electrical conductivity only in the vertical direction, i.e., between the contact substrate 20 and the probe card 60.

On the bottom surface of the contact substrate 20, electrodes 292 are provided. Alternatively, the electrodes 292 may be formed on the bottom surface of the support frame 55. The electrodes 292 are provided at three or more locations on bottom surface of the contact substrate 20. Each location of the electrode 292 is preferably close to an edge of the contact substrate 20 in such a way to form vertexes of a triangular or polygonal shape.

The probe card 60 is mounted on a frame 240 of the probe contact system through a probe card ring 260. The probe card ring 260 is connected to the frame 240 by fastening means such as screws 252. Between the probe card 60 and the probe card ring 260, one or more shims 70 such as thin plates or films are inserted to adjust the planarity of the contactors 30. An example of shim 70 includes a Teflon film, Mylar film, metal film, metal plate and the like. A semiconductor wafer 300 to be tested is placed on a chuck 180 of the substrate handler 400 (FIG. 1) such as a wafer prober. Although not shown, it is known in the art that the frame 240 of the probe contact system and the housing of the substrate handler are mechanically connected with each other.

The example of FIG. 6 further shows gap sensors 290 on the semiconductor wafer 300 and a gap measurement instrument 280 which receives signals from the gap sensors 290. The gap sensors 290 are in the form of electrodes and are placed on the surface of the semiconductor wafer 300 at positions corresponding to the electrodes 292 on the bottom surface of the contact substrate 20, i.e, at three or more locations thereon. The relationship between the gap sensor 290 and the electrodes 292 can be reversed. Namely, the gap sensor 290 can be provided on the bottom surface of the contact substrate and the electrode 292 can be provided on the upper surface of the semiconductor wafer 300. Further, a reference plate made of, for example, ceramic or alumina may be used in lieu of the semiconductor wafer 300 which is typically a customer wafer so that the planarity of the probe contact system is adjusted prior to the shipment to customers.

For example, the gap sensor 290 is a capacitance sensor to measure capacitance between the sensor 290 and the opposite electrode 292. The measured capacitance value is a function of the distance between the sensor and electrode. An example of such gap sensors is a model HPT-500-V offered by Capacitec, Inc., 87 Fichburg Road, Ayer, Mass. By monitoring the gap between the sensor 290 and the electrode 292 measured by the gap measurement instrument 280, an operator adjusts the number of shims 70 inserted between the probe card 60 and the probe card ring 260 in such a way that the gap at each of three locations becomes identical to one another.

FIG. 7 is a perspective view showing an upper surface of the probe card 60 in the probe contact system of the present invention. The shims 70 are inserted between the probe card 60 and the probe card ring 260 at, for example, three or more locations as shown in FIG. 7. When three locations of the shims are used, preferably such three locations are selected to be vertexes of a regular triangle. The number of shims 70 is adjusted to control the angle of the probe card as well as the contact substrate 20 fixedly connected to the probe card. Such an adjustment is made based on the reading on the gap measurement instrument 280 which measures the distance between the electrodes 290 and 292 at each of three or more locations.

According to the present invention, the probe contact system is capable of adjusting the distances between tips of contactors and the surface of the semiconductor wafer under test or reference plate. The planarity adjustment mechanism is capable of adjusting the distances between the contact substrate and the semiconductor wafer so that all of contactors on the contact substrate contact the surface of the semiconductor wafer at substantially the same time with substantially the same pressure.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A planarity adjustment mechanism for a probe contact system for establishing electrical connection with contact targets, comprising:

a contact substrate having a plurality of contactors mounted on a surface thereof;

a probe card for establishing electrical communication between the contactors and a test head of a semiconductor test system;

a conductive elastomer having an elastic sheet provided between the contact substrate and the probe card;

connection means for fixedly connecting the contact substrate with the probe card;

a gap sensor for measuring a distance between the contact substrate and the contact targets in a non-contact manner, the gap sensor being directly formed on the contact substrate;

a probe card ring mounted on a frame of the probe contact system for mounting the probe card on an inner area thereof; and a plurality of shims provided between the probe card and the probe card ring at three or more locations wherein the shim is a piece of thin film or plate and a number of shims at each of the locations is adjusted so that distances between tips of the contactors and surfaces of the contact targets become identical to one another.

2. A planarity adjustment mechanism for a probe contact system as defined in claim 1, wherein the conductive elastomer provided between the contact substrate and the probe card is an elastic sheet establishing electrical communication between the contact substrate and the probe card.

3. A planarity adjustment mechanism for a probe contact system as defined in claim 2, further comprising a support frame provided between the contact substrate and the conductive elastomer for supporting the contact substrate wherein the connection means is extended between the probe card and the support frame.

4. A planarity adjustment mechanism for a probe contact system as defined in claim 2, wherein the conductive elastomer is comprised of a silicon rubber sheet and metal filaments running in a vertical direction so as to establish communication only in the vertical direction.

5. A planarity adjustment mechanism for a probe contact system as defined in claim 1, the gap sensor measures a distance between the contact substrate and a semiconductor wafer to be tested or a reference plate (target substrate).

6. A planarity adjustment mechanism for a probe contact system as defined in claim 5, wherein the gap sensor determines the distance between the contact substrate and the target substrate by measuring capacitance between the gap sensor and an electrode opposing to the gap sensor.

7. A planarity adjustment mechanism for a probe contact system as defined in claim 5, wherein the gap sensor is provided either on an upper surface of the target substrate or a bottom surface of the contact substrate.

8. A planarity adjustment mechanism for a probe contact system as defined in claim 5, wherein the reference plate is a ceramic substrate or an alumina substrate having electrodes at positions opposite to the gap sensor.

9. A planarity adjustment mechanism for a probe contact system as defined in claim 1, wherein the three locations for inserting the shims between the probe card and the probe card ring correspond to vertexes of a regular triangle.

* * * * *